US006781376B2

(12) United States Patent
Schaaf

(10) Patent No.: US 6,781,376 B2
(45) Date of Patent: Aug. 24, 2004

(54) GRADIENT COIL SYSTEM WITH FIRST AND SECOND TRANSVERSE GRADIENT COIL AXIALLY OFFSET ON A COMMON CYLINDER ENVELOPE AND MAGNETIC RESONANCE APPARATUS HAVING THE GRADIENT COIL SYSTEM

(75) Inventor: Michael Schaaf, Oberreichenbach (DE)

(73) Assignee: Siemens Aktiengesellschaft, Münich (DE)

( * ) Notice: Subject to any disclaimer, the term of this patent is extended or adjusted under 35 U.S.C. 154(b) by 32 days.

(21) Appl. No.: 10/131,844

(22) Filed: Apr. 25, 2002

(65) Prior Publication Data

US 2002/0175684 A1 Nov. 28, 2002

(30) Foreign Application Priority Data

Apr. 25, 2001 (DE) .......................................... 101 20 284

(51) Int. Cl.$^7$ ................................................. G01V 3/00
(52) U.S. Cl. ....................................................... 324/318
(58) Field of Search ......................... 324/300, 307–309, 324/318, 322, 319; 600/410

(56) References Cited

U.S. PATENT DOCUMENTS

| | | | | |
|---|---|---|---|---|
| 4,646,024 A | * | 2/1987 | Schenck et al. | 324/318 |
| 5,012,192 A | * | 4/1991 | Siebold | 324/318 |
| 5,177,442 A | * | 1/1993 | Roemer | 324/318 |
| 5,489,848 A | * | 2/1996 | Furukawa | 324/318 |
| 5,561,371 A | * | 10/1996 | Schenck | 324/318 |
| 5,600,245 A | | 2/1997 | Yamamoto et al. | |
| 5,675,255 A | | 10/1997 | Sellers et al. | |
| 5,736,858 A | * | 4/1998 | Katznelson et al. | 324/318 |
| 5,760,582 A | * | 6/1998 | Morrone | 324/318 |
| 5,764,059 A | * | 6/1998 | Mansfield et al. | 324/318 |
| 5,786,694 A | * | 7/1998 | Kilian et al. | 324/318 |
| 5,804,968 A | * | 9/1998 | Richard et al. | 324/318 |
| 5,939,882 A | | 8/1999 | Gebhardt et al. | |
| 5,952,830 A | * | 9/1999 | Petropoulos et al. | 324/318 |
| 6,011,394 A | * | 1/2000 | Petropoulos et al. | 324/318 |
| 6,043,653 A | * | 3/2000 | Takamori et al. | 324/309 |
| 6,049,207 A | * | 4/2000 | Petropoulos | 324/318 |
| 6,111,412 A | | 8/2000 | Boemmel et al. | |
| 6,144,204 A | * | 11/2000 | Sementchenko | 324/318 |
| 6,181,227 B1 | * | 1/2001 | Schmidt et al. | 335/299 |
| 6,342,787 B1 | * | 1/2002 | Petropoulos et al. | 324/320 |
| 6,351,123 B1 | | 2/2002 | Gebhardt | |
| 6,448,774 B1 | * | 9/2002 | Heid | 324/318 |
| 6,479,997 B1 | * | 11/2002 | Westphal et al. | 324/318 |
| 6,525,537 B2 | * | 2/2003 | Nerreter | 324/322 |
| 6,545,473 B1 | * | 4/2003 | Gebhardt et al. | 324/318 |
| 6,552,545 B2 | * | 4/2003 | Kaindl et al. | 324/318 |

FOREIGN PATENT DOCUMENTS

| | | |
|---|---|---|
| DE | 196 12 478 | 9/1997 |
| DE | 196 53 449 | 6/1998 |
| DE | 197 22 211 | 8/1998 |
| DE | 197 21 985 | 12/1998 |
| DE | 198 29 298 | 1/2000 |
| DE | 199 43 372 | 4/2001 |
| GB | 2331808 | 6/1999 |
| GB | 2 331 808 | 6/1999 |

* cited by examiner

Primary Examiner—Christopher W. Fulton
Assistant Examiner—Dixomara Vargas
(74) Attorney, Agent, or Firm—Schiff Hardin LLP

(57) ABSTRACT

A gradient coil system and magnetic resonance apparatus having the gradient coil system is provided in which the gradient coil system comprises a first and a second transverse gradient coil, these coils being arranged alongside each other axially offset on a common cylinder envelope, where the cylinder envelope has at least one circumferential line which is overlapped by both gradient coils.

13 Claims, 2 Drawing Sheets

GRADIENT COIL SYSTEM WITH FIRST AND SECOND TRANSVERSE GRADIENT COIL AXIALLY OFFSET ON A COMMON CYLINDER ENVELOPE AND MAGNETIC RESONANCE APPARATUS HAVING THE GRADIENT COIL SYSTEM

BACKGROUND OF THE INVENTION

1. Field of the Invention

The invention relates to a gradient coil system, in particular for a magnetic resonance apparatus, and a magnetic resonance apparatus having the gradient coil system.

2. Description of the Related Art

The magnetic resonance technique is a known technique for obtaining images of the interior of a body of an examination subject. For this purpose, a magnetic resonance apparatus includes a basic field magnet system and a gradient coil system. The basic field magnet system has, for example, a cylindrical hollow with the gradient coil system arranged within; this coil system is, in this example, likewise of a hollow cylindrical shape. A diameter of the hollow of the basic field magnet system, in particular in the case of superconducting basic field magnet systems, is proportional to its cost. The greater the diameter of the basic field magnet system to be designed, in order to accommodate an internal the gradient coil system, the more costly the basic field magnet system will be. Furthermore, the magnetic resonance apparatus comprises a radio frequency system which radiates radio frequency signals into the examination subject in order to trigger magnetic resonance signals and receives the generated magnetic resonance signals, which are used to create magnetic resonance images.

An imaging volume is defined inside a hollow of the hollow-cylinder-shaped gradient coil system. The basic field magnet system generates an (as far as possible) homogeneous, static basic magnetic field at least inside the imaging volume. The basic magnetic field is collinear with the principal axis of the hollow cylinder, to which a z-axis of a cartesian coordinate system is customarily assigned. The gradient coil system superimposes rapidly switched magnetic gradient fields on the basic magnetic field at least inside the imaging volume.

A gradient coil of the gradient coil system generates, for a particular direction in space, a gradient field which (in the ideal case) has exclusively a field component which is collinear with the basic magnetic field, at least inside the imaging volume. The field component has a predeterminable gradient which is, irrespective of location, approximately of the same magnitude at any point in time, at least inside the imaging volume. Since the gradient field is a time-variable magnetic field, the aforementioned is admittedly true of any point in time, but from one point in time to another point in time a strength of the gradient is variable. The direction of the gradient is generally fixed in a predetermined manner by the design of the gradient coil. To generate the gradient field, appropriate currents are set in the gradient coil. The amplitudes of the required currents are in the range of several hundred Amperes (A). The rates of rise and fall of the current (slew rate) amount to several hundred kA/s.

The gradient coil system is generally surrounded by conductive structures in which the switched gradient fields induce eddy currents. Examples of such conductive structures are a vacuum vessel and/or a cold shield of a superconducting basic field magnet system. The fields generated by the eddy currents are undesirable since, if no counter-measures are taken, they weaken the gradient field and distort it in its time characteristic. This impairs the quality of magnetic resonance images. These eddy current fields are compensated for, inter alia, by using actively screened gradient coils. A screening coil associated with a gradient coil generally has a smaller number of turns than the gradient coil, and is connected to the gradient coil in such a way that the screening coil has the same current flowing through it as the gradient coil, but in the opposite direction.

German patent document DE 197 22 211 A1 presents an example of a construction of a hollow-circular-cylinder-shaped gradient coil system having screening coils. The gradient coil system comprises, the following elements (from the inside outwards) which are formed in hollow-circular-cylinder-shaped regions arranged concentrically with one another: a first transverse gradient coil, comprising four saddle-shaped coil sections for generating a gradient field having a first gradient perpendicular to the principal axis of the hollow cylinder, a second transverse gradient coil, comprising four saddle-shaped coil sections for generating a gradient field having a second gradient perpendicular to the principal axis of the hollow cylinder, a first cooling arrangement, a longitudinal gradient coil for generating a gradient field having a gradient in the direction of the principal axis of the hollow cylinder, a shim assembly, a second cooling arrangement, a longitudinal screening coil assigned to the longitudinal gradient coil, a first transverse screening coil assigned to the first transverse gradient coil and a second transverse screening coil assigned to the second transverse gradient coil.

German patent document DE 196 53 449 A1 discloses a gradient coil system in which its gradient coils are arranged on two radially spaced surfaces lying symmetrical to a longitudinal axis of an examination chamber of a magnetic resonance apparatus, and the surfaces have, in radial section, a curvature such that a distance between the two surfaces is greater at the center than at the edge. The distance between the two surfaces gives rise to additional space laterally in the center of the examination chamber so that, for example, the diameter of the hollow of the basic field magnet system can be reduced.

German patent document DE 199 43 372 presents a hollow-cylinder-shaped gradient coil system of a magnetic resonance apparatus having an elliptical inner cross-section, a first and a second transverse gradient coil being arranged alongside each other on an inner cylinder envelope of the gradient coil system. The gradient coils comprise, in each case, four saddle-shaped coil sections arranged point-symmetrically with respect to a geometrical center point of the gradient coil system.

German patent document DE 196 12 478 C1 describes a hollow-circular-cylinder-shaped gradient coil system for a magnetic resonance apparatus having a first and a second transverse gradient coil of a segment type. The gradient coils comprise, in each case, a plurality of coil pairs which are arranged along a principal axis of the hollow cylinder and comprise, in each case, two circular-ring-segment-shaped coil sections arranged point-symmetrically with respect to the principal axis of the hollow cylinder. The coil sections of both gradient coils are arranged alongside each other on a circular-cylinder envelope of the gradient coil system; the two gradient coils have different numbers of coil pairs from each other and, when viewed in the direction of the principal axis of the hollow cylinder, the circular-ring-segment-shaped coil sections of the first gradient coil overlap those of the second.

Furthermore, German patent document DE 198 29 298 A1 presents an example of a gradient coil system which can be used to image, for example, only part of a patient's body such as the patient's head. This type of gradient coil system is often designed so that a linearity center of a gradient coil of the gradient coil system is offset relative to a geometrical center of the gradient coil system. Such an asymmetrical gradient coil system is often constructed with a torque-compensated conductor design. The conductor design is such that tilting moments, which occur with respect to a geometrical center point of the gradient coil system due to Lorentz forces when current flows in the gradient coil, cancel each other out. Each of the above-mentioned German patent documents is incorporated herein by reference.

SUMMARY OF THE INVENTION

An object of the invention is to provide an improved gradient coil system which, inter alia, allows a space-efficient construction of the gradient coil system.

The object is achieved by a gradient coil system, in particular for a magnetic resonance apparatus, that includes the following features:

the gradient coil system comprises a first and a second transverse gradient coil, the gradient coils are arranged alongside each other axially offset on a common cylinder envelope and the cylinder envelope has at least one circumferential line which is overlapped by both gradient coils.

The circumferential line corresponds to the circumference of a section which is taken perpendicularly to a generatrix of the cylinder envelope.

The following advantages are thus obtained for the inventive gradient coil system compared with a comparable conventional gradient coil system, in particular compared with a known gradient coil system in accordance with German patent document DE 197 22 211 A1: for an identical outside diameter, a greater inside diameter can be chosen, thereby resulting in greater patient comfort with regard to space. For an identical inside diameter, a smaller outside diameter can be chosen which also enables, for example, a corresponding reduction of a hollow of a superconducting basic field magnet system; this leads to a considerable cost saving. Furthermore, for identical dimensions, more room is obtained, for example, for arranging further coils and/or for designing at least one coil as a coil which is switchable and/or of a 3D design. Due to the arrangement of the two transverse gradient coils alongside each other, the first and the second transverse gradient coil are arranged in a manner such that they do not mutually overlap, thereby furthermore markedly reducing a risk of electrical flashovers between the transverse gradient coils. This also improves a partial-discharge behavior of the gradient coil system.

In an advantageous refinement, the gradient coil system comprises a cooling arrangement which is arranged immediately adjacent to the transverse gradient coils and between the transverse gradient coils and a further longitudinal gradient coil. Because the first and the second transverse gradient coil are arranged in a manner such that they do not mutually overlap, a large-area cooling of all three gradient coils is possible using the one cooling arrangement.

In an advantageous refinement, at least one of the transverse gradient coils is designed in a torque-compensated manner. This results in improved preconditions for reducing noise which may occur during operation of a gradient coil in a magnetic resonance apparatus.

DESCRIPTION OF THE DRAWINGS

Further advantages, features and details of the invention emerge from the exemplary embodiments described below with reference to the drawings.

DETAILED DESCRIPTION OF THE INVENTION

Figure 1:
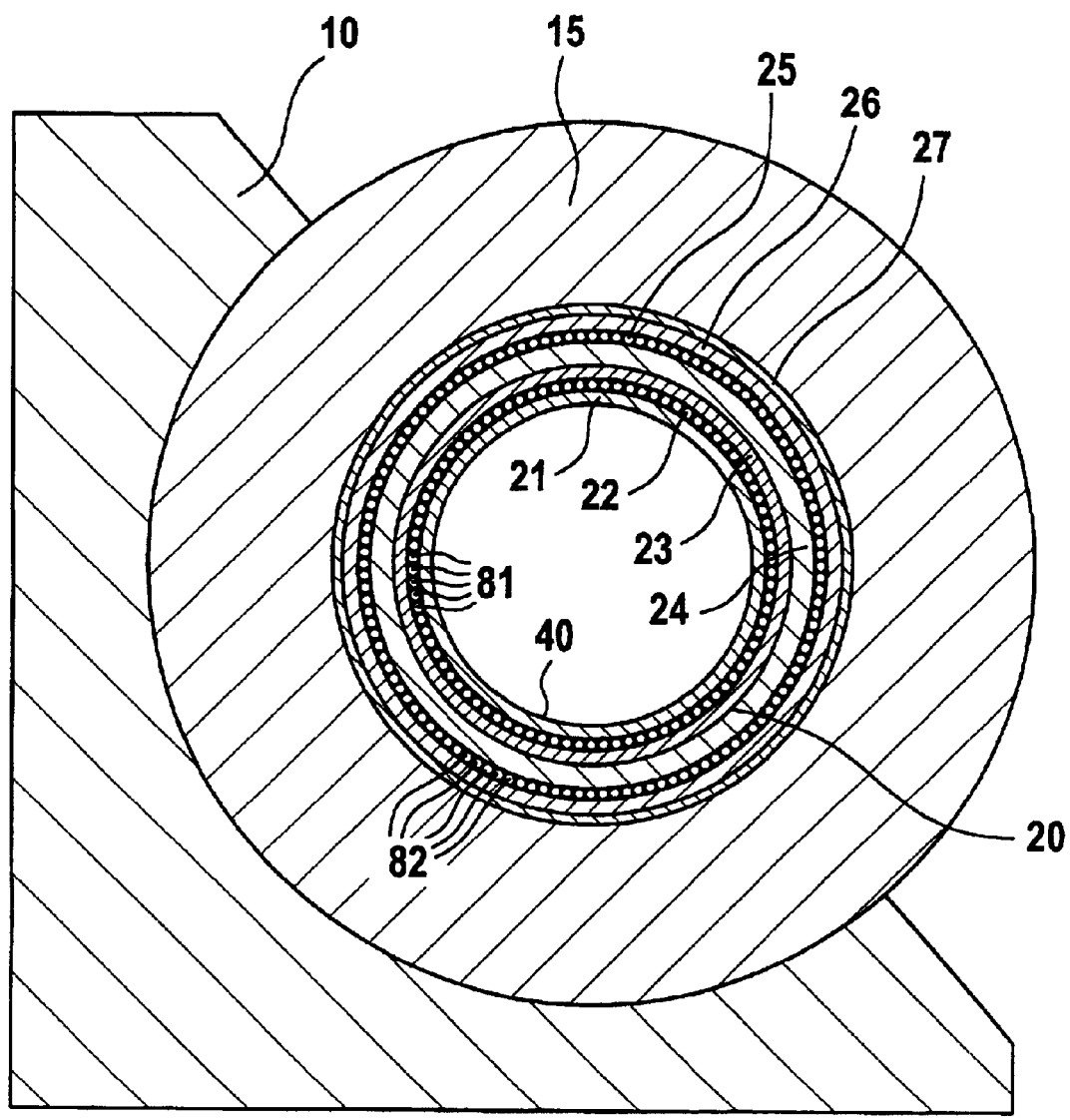
FIG. 1 is a schematic cross-section through a magnetic resonance apparatus having a gradient coil system.

FIG. 1 shows, as an exemplary embodiment of the invention, a cross-section through a magnetic resonance apparatus 10. The magnetic resonance apparatus 10 comprises a substantially hollow-circular-cylinder-shaped ("HCCS") basic field magnet system 15 for generating a static, as far as possible, homogeneous basic magnetic field. A likewise substantially HCCS gradient coil system 20 is arranged in a hollow of the basic field magnet system 15, for generating rapidly switched gradient fields which are superimposed on the basic magnetic field.

The gradient coil system 20 comprises, from the inside outwards, the following HCCS regions 21 to 27, arranged concentrically with one another: a first HCCS region 21 comprises a first transverse gradient coil 31 for generating a gradient field having a first gradient perpendicular to the principal axis of the hollow cylinder, and a second transverse gradient coil 32 for generating a gradient field having a second gradient perpendicular to the principal axis of the hollow cylinder. The transverse gradient coils 31 and 32 are arranged alongside each other on an inner cylinder envelope 40 of the first region 21. A more detailed description of this is illustrated by FIG. 2.

A second HCCS region 22, which surrounds the first region 21 immediately adjacently, comprises a cooling arrangement 81 for cooling the two transverse gradient coils 31 and 32, among other things. The cooling arrangement 81 may be designed, for example, in accordance with German patent document DE 197 21 985 A1, incorporated herein by reference. A third HCCS region 23 comprises a longitudinal gradient coil for generating a gradient field having a gradient collinear with the principal axis of the hollow cylinder. The longitudinal gradient coil comprises, for example, two solenoid coil sections. Because the first and the second transverse gradient coil 31 and 32 are arranged in the first region 21 in a manner such that they do not mutually overlap, immediate and thus highly efficient cooling of all three gradient coils is possible using the one cooling arrangement 81.

A fourth HCCS region 24, which immediately surrounds the third region 23, comprises active and/or passive shim devices. A further cooling arrangement 82, which may be designed, for example, in accordance with German patent document DE 197 21 985 A1, is arranged in a fifth HCCS region 25. A longitudinal screening coil, assigned to the longitudinal gradient coil, is arranged in a sixth HCCS region 26. Lastly, a seventh HCCS region 27 comprises a first and a second transverse screening coil, assigned respectively to the first and second transverse gradient coil 31 and 32. Conductors of the first and second transverse screening coil are arranged, with respect to an inner cylinder envelope of the seventh region 27, in accordance with the first and second transverse gradient coil 31 and 32. Further components of the magnetic resonance apparatus 10, such as an antenna system arranged in a hollow of the gradient coil system 20, are not illustrated for reasons of clarity.

Figure 2:
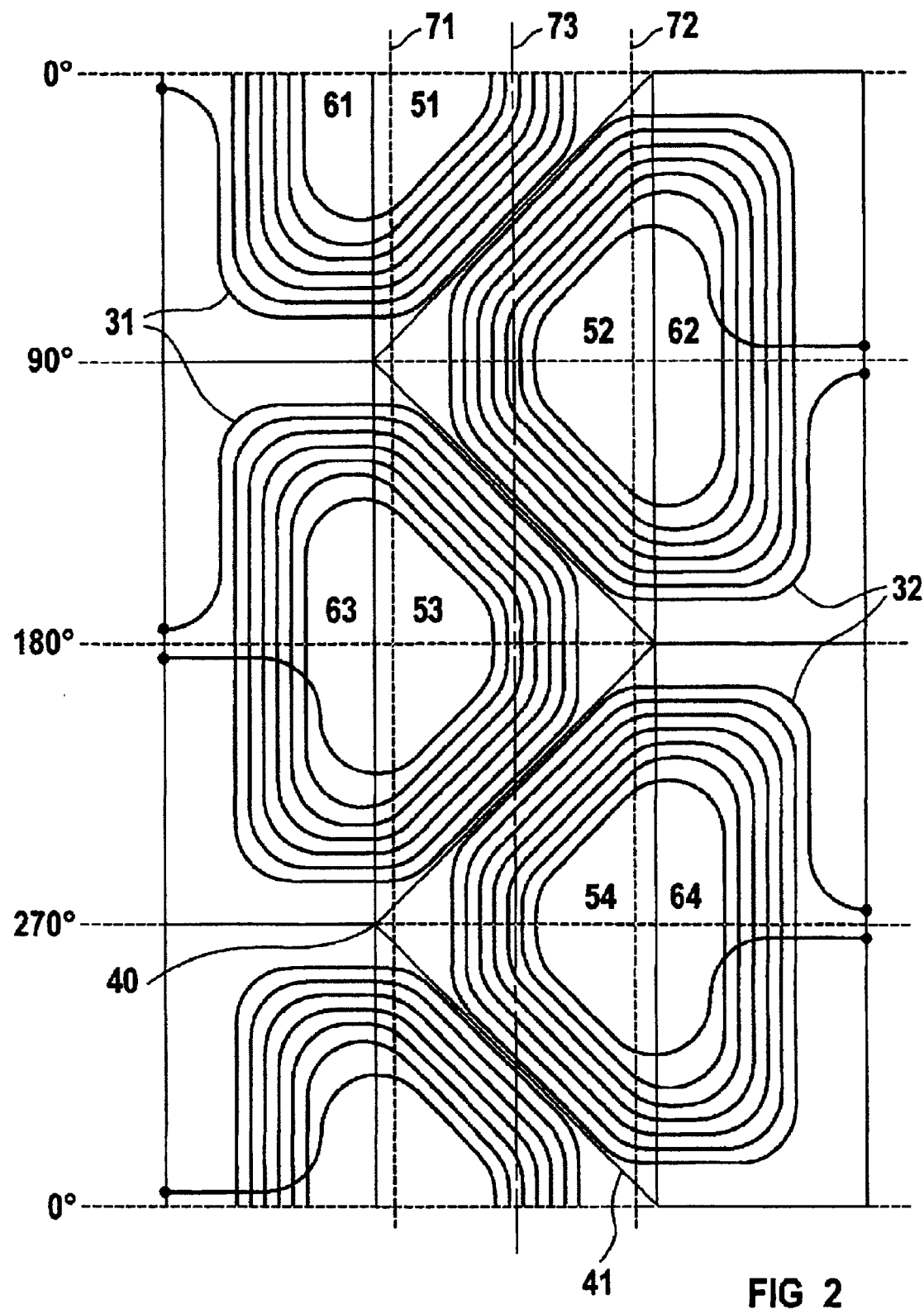
FIG. 2 is a schematic representation of an inner cylinder envelope of the gradient coil system, rolled out onto a plane.

In FIG. 2, the inner cylinder envelope 40 of FIG. 1 with the transverse gradient coils 31 and 32 arranged on it is shown in a representation rolled out onto a plane. The conductor routing of the first and the second transverse gradient coil 31 and 32 is illustrated schematically. The cylinder envelope 40 has at least one circumferential line 73 which is overlapped by both gradient coils 31 and 32. This circumferential line 73 at the same time denotes a geometrical center point and/or center of gravity of the gradient coil system 20.

The inner cylinder envelope 40 has a cylinder-envelope-shaped center region 41, which is subdivided into four triangles 51 to 54 of the same shape, the vertices of which are all arranged on boundary lines of the center region 41. Furthermore, in its marginal regions, the cylinder envelope 40 is subdivided into four rectangles 61 to 64, each having a width predetermined by the length of one side of the triangles 51 to 54. The first gradient coil 31 is arranged on the triangles 51 and 53 and on the rectangles 61 and 63 associated with the triangles 51 and 53, whereas the second gradient coil 32 is arranged on the triangles 52 and 54 and on the rectangles 62 and 64 associated with the triangles 52 and 54. The first and the second transverse gradient coil 31 and 32 thus each consist of two coil sections lying mutually opposite in the hollow circular cylinder. Furthermore, the first and the second transverse gradient coil 31 and 32 have geometrical center points and/or centers of gravity 71 and 72 which are different from each other and do not coincide with a geometrical center point and/or center of gravity 73 of the gradient coil system 20 either. The geometrical center points and/or centers of gravity 71 to 73 are represented as lines in accordance with the representation of the cylinder envelope 40 rolled out onto a plane.

Under certain preconditions, the gradient coil system 20 exhibits particularly favorable properties with regard to stimulation of a live examination subject, in particular a patient, due to the switched gradient fields of the first and second transverse gradient coil 31 and 32. The previously mentioned preconditions include the patient being positioned in the hollow of the gradient coil system 20 in such a way that, in the direction of the principal axis of the hollow cylinder, the patient extends mainly in one of the two regions separated from each other by the geometrical center point 73, and that the gradient of the transverse gradient coil 31 or 32 which surrounds the region in which the patient mainly extends has a sagittal direction with respect to the patient. In the gradient coil system 20 illustrated in FIG. 2, the previously mentioned preconditions can be ensured, for example, by the patient being introduced into the gradient coil system 20 from the left in a prone position, on a plane defined by a 90° and 270° line, using an appropriate positioning device, merely to such a degree that the patient extends substantially to the left of the geometrical center 73. Consequently, the previously mentioned particularly favorable stimulation properties of the gradient coil system 20 can be utilized, especially in examinations of the patient's head.

For the purposes of promoting an understanding of the principles of the invention, the invention has been described referencing the preferred embodiments illustrated in the drawings, and specific language used to describe these embodiments. However, no limitation of the scope of the invention is intended by this specific language, and the invention should be construed to encompass all embodiments that would normally occur to one of ordinary skill in the art. No item or component is essential to the practice of the invention unless the element is specifically described as "essential" or "critical". Numerous modifications and adaptations will be readily apparent to those skilled in this art without departing from the spirit and scope of the present invention.

What is claimed is:

1. A gradient coil system for a magnetic resonance apparatus, comprising:
   a first and a second transverse gradient coil that are arranged alongside each other axially offset on a common cylinder envelope, the cylinder envelope having at least one circumferential line that is overlapped in a radial direction by both the first and the second gradient coils.

2. The gradient coil system according to claim 1, further comprising at least one cylinder-envelope-shaped center region of the cylinder envelope that comprises four triangles of a same shape, the vertices of the triangles being arranged on boundary lines of the center region, and one of the first and second gradient coils is arranged on respectively one of areas formed by respectively two triangles which do not have a common boundary line.

3. The gradient coil system according to claim 2, further comprising:
   areas extended by rectangles which adjoin boundary lines of the center region with the length of one side predetermined by the triangles, and one of the first and second gradient coils being arranged on respectively one of the extended areas.

4. The gradient coil system according to claim 1, wherein at least one of a center of gravity and a geometrical center point of at least one of the gradient coils differs from at least one of a center of gravity and a geometrical center point of the gradient coil system.

5. The gradient coil system according to claim 1, wherein at least one of a centers of gravity and a geometrical center points of the first and second gradient coils differ from each other.

6. The gradient coil system according to claim 1, wherein the at least one circumferential line is circular or elliptical.

7. The gradient coil system according to claim 1, wherein at least one of the first and second gradient coils is of a torque-compensated design.

8. The gradient coil system according to claim 1, wherein at least one of the first and second gradient coils comprises two coil sections.

9. The gradient coil system according to claim 1, further comprising screening coils assigned to the first and second gradient coils.

10. The gradient coil system according to claim 9, wherein the screening coils are designed in accordance with the first and second gradient coils.

11. The gradient coil system according to claim 1, further comprising at least one cooling arrangement that is arranged adjacently to the first and second gradient coils.

12. The gradient coil system according to claim 11, further comprising:
   a longitudinal gradient coil, wherein the at least one cooling arrangement is arranged between the transverse first and second gradient coils and a longitudinal gradient coil.

13. A magnetic resonance apparatus having a gradient coil system comprising a first and a second transverse gradient coil that are arranged alongside each other axially offset on a common cylinder envelope, the cylinder envelope having at least one circumferential line that is overlapped in a radial direction by both the first and the second gradient coils.

* * * * *